United States Patent
Letessier et al.

(10) Patent No.: US 7,487,806 B2
(45) Date of Patent: Feb. 10, 2009

(54) SOURCE LIQUID SUPPLY APPARATUS HAVING A CLEANING FUNCTION

(75) Inventors: Olivier Letessier, Paris (FR); Masao Kimura, Ibaraki (JP); Jean-Marc Girard, Paris (FR); Akinobu Nasu, Ibaraki (JP)

(73) Assignee: L'Air Liquide, Societe Anonyme A Directorie et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 638 days.

(21) Appl. No.: 10/495,775

(22) PCT Filed: Nov. 13, 2002

(86) PCT No.: PCT/EP02/13491

§ 371 (c)(1),
(2), (4) Date: Oct. 12, 2004

(87) PCT Pub. No.: WO03/041881

PCT Pub. Date: May 22, 2003

(65) Prior Publication Data

US 2005/0109374 A1     May 26, 2005

(30) Foreign Application Priority Data

Nov. 15, 2001    (JP)   ............... 2001-350168

(51) Int. Cl.
*B65B 1/04*      (2006.01)
(52) U.S. Cl. .............. 141/92; 141/11; 141/69; 141/63; 141/100; 141/302
(58) Field of Classification Search ......... 141/11, 141/69, 70, 85, 89, 91, 92, 98, 100, 302, 141/59, 63, 64; 134/11, 166 R; 118/715, 118/726; 122/379
See application file for complete search history.

(56) References Cited

U.S. PATENT DOCUMENTS 4,723,967 A     2/1988    Tom (Continued)

FOREIGN PATENT DOCUMENTS

GB     1 150 045 A     4/1969

(Continued)

OTHER PUBLICATIONS

International Search Report for PCT/EP 02/13491, Mar. 11, 2003.

(Continued)

*Primary Examiner*—Timothy L Maust
(74) *Attorney, Agent, or Firm*—Brandon S. Clark

(57) ABSTRACT

A source liquid supply apparatus and method that avoids leaving source liquid-and/or cleaning fluid-derived residues in the vicinity of the connection region between the source liquid feed conduit and the source tank. A flow-switching mechanism is attached to the source tank of a source liquid supply apparatus. This flow-switching mechanism has a first port connected to the discharge port conduit of the source tank, a second port connected to a feed conduit, and a third port connected to an exhaust conduit. The first port can be closed by a valve member on a diaphragm disposed within a common compartment while communication is maintained between the second and third ports. A cleaning fluid source and a purge gas source are connected to the feed conduit. Purge gas and cleaning fluid fed into the feed conduit are discharged from the second and third ports and through the exhaust conduit.

11 Claims, 10 Drawing Sheets

U.S. PATENT DOCUMENTS

| | | | |
|---|---|---|---|
| 4,738,693 A | 4/1988 | Tom | |
| 5,362,328 A | 11/1994 | Gardiner | |
| 5,690,743 A | 11/1997 | Murakami et al. | |
| 5,846,338 A * | 12/1998 | Bonora et al. | 134/11 |
| 5,950,646 A * | 9/1999 | Horie et al. | 134/105 |
| 5,964,230 A | 10/1999 | Voloshin et al. | |
| 6,026,762 A * | 2/2000 | Kao et al. | 118/723 ME |
| 6,033,479 A | 3/2000 | Ikeda | |
| 6,079,426 A * | 6/2000 | Subrahmanyam et al. | 134/1.1 |
| 6,178,925 B1 * | 1/2001 | Sturm et al. | 122/390 |
| 6,199,599 B1 | 3/2001 | Gregg et al. | |
| 6,240,952 B1 | 6/2001 | Schroeder | |
| 6,848,458 B1 * | 2/2005 | Shrinivasan et al. | 134/108 |

FOREIGN PATENT DOCUMENTS

| | | |
|---|---|---|
| JP | 64-27616 | 1/1989 |
| JP | 08-17749 | 1/1996 |

OTHER PUBLICATIONS

Patent Abstracts of Japan, publication No. 10-135154, published May 22, 1998; application No. 08-292565, filed Nov. 5, 1996.

Patent Abstracts of Japan, publication No. 10-88349, published Jul. 7, 1998; applicaation No. 08-246188, filed Sep. 18, 1996.

* cited by examiner

SOURCE LIQUID SUPPLY APPARATUS HAVING A CLEANING FUNCTION

This application is a 371 of International PCT Application PCT/EP2002/013491, filed Nov. 13, 2002.

BACKGROUND OF THE INVENTION

This invention relates to a source liquid supply apparatus having a cleaning function, to a method for detaching the source tank from said supply apparatus, and to a method for cleaning a source liquid feed conduit. More particularly, this invention relates to the structure of an apparatus for supplying a source liquid, such as a chemical reagent, to a particular facility, for example, to a metalorganic chemical vapor deposition (MOCVD) apparatus. The invention additionally relates to a maintenance technology for said supply apparatus.

The equipment used to fabricate semiconductor devices and electronic devices and instruments frequently employs source liquids in the form of difficult-to-handle chemical reagents whose residues are difficult to remove simply by a gas purge. Once such a source liquid has passed through, for example, a manifold or vaporizer, the interior thereof cannot be satisfactorily treated by purging and cleaning with just a simple gas purge cycle (repetitive pressurization with gas and vacuum exhaust) when it is desired to carry out maintenance or exchange or alter the reagent. A known technology that addresses this problem comprises the use, in addition to the gas purge, of a solvent as a cleaning fluid in order to achieve good purging and cleaning of the target compartment.

An apparatus that employs this particular technology is disclosed in U.S. Pat. No. 5,964,230. This apparatus, which carries out solvent-based purging and cleaning of a chemical-handling manifold, introduces solvent into the manifold through a nozzle disposed coaxially with respect to the manifold and employs a mechanical scrubbing operation in addition to residue dissolution.

U.S. Pat. No. 6,033,479 discloses a process gas delivery apparatus for MOCVD applications that employs an auxiliary cleaning apparatus. A slanted cleaning fluid feed pipe is provided in this system in order to feed cleaning fluid into the process gas delivery apparatus and for discharge of the waste cleaning fluid. This system also contains an optical sensor in the process gas feed pipe in order to determine the maintenance time automatically. This optical sensor can be used both to detect the accumulation of deposited material in the piping and to detect cleaning fluid remaining within the piping after the cleaning process.

U.S. Pat. No. 5,362,328 discloses an apparatus and method for feeding source reagent in vaporized form into a CVD process compartment. In this case, an auxiliary cleaning apparatus is used in order to protect the source reagent vaporizer from the negative influence of solid deposits produced during the CVD process. For example, when it is desired to feed relatively nonvolatile source reagent to the CVD process compartment, the vaporizer may be configured with a large surface area having a high heat transfer efficiency. When such a vaporizer is used in a CVD system, by-products are produced in the vaporizer section from the source reagent, which causes clogging and lowers the vaporizing efficiency. The technology disclosed in U.S. Pat. No. 5,362,328 solves these problems by implementing a periodic cleaning of the vaporizer with an auxiliary cleaning apparatus.

U.S. Pat. No. 4,738,693 (Japanese Laid Open (Kokai or Unexamined) Patent Application Number Sho 64-27616 (27,616/1989)) teaches an apparatus for distributing and purifying semiconductor source reagents. This apparatus is provided with a receptacle and valve block that can be joined to each other in a leaktight manner. The valve block is provided with first and second ports for feeding source reagent and with a purge port for effecting purging. Prior to feeding source reagent, the purge port is opened—while the first and second ports are closed—in order to eliminate gas remaining in the dead spaces from the first and second ports and the gas flow passages.

An apparatus for reagent supply is disclosed in U.S. Pat. No. 6,199,599 (issued 13 Mar. 2001); this apparatus employs at least three purge sources for the purpose of purging reagent from the piping system. For example, a vacuum source, solvent source, and inert gas source are used as three purge sources, wherein the solvent is expelled from the system accompanying feed of the inert gas.

A problem common to the type of prior art systems under consideration, including the systems taught in the United States patents listed above, is the presence of a difficult-to-purge dead space in the vicinity of the joint or connection between the source tank and the conduit for feeding source liquid to the process apparatus. As a consequence, even after the piping has been purged, substances such as source liquid, cleaning fluid, and semidecomposed materials therefrom can easily remain within this dead space. When, for example, these residues come into contact with air when the source tank is exchanged, they form difficult-to-remove substances that clog the piping or produce substances that poison the process. Taking as an example the use of PET (pentaethoxytantalum) to form high dielectric films, upon contact with air this reagent reacts with $O_2$ and $H_2O$ to form a gel-like material. In the case of $TiCl_4$ the reaction of this compound with $H_2O$ results in the production of HCl, a chemical that lowers the film-forming rate.

This invention was developed in view of the problems delineated above for the prior art. An object of this invention is to provide a source liquid supply apparatus that incorporates a cleaning function and that avoids leaving source liquid- and/or cleaning fluid-derived residues in the vicinity of the joint or connection region between the source liquid feed conduit and the source tank. An additional object of this invention is to provide a method for detaching the source tank from the foregoing apparatus. A further object of this invention is to provide a method for cleaning a source liquid feed conduit.

SUMMARY

This invention relates to a source liquid supply apparatus and method of operation which includes using a pressurized gas, in addition to a purge gas, with a leaktight source tank having a discharge port and a pressurization port. A pressurization gas conduit along with a flow-switching mechanism which is attached to the discharge port operates in such a manner that prevents residue buildup from the source liquid or the cleaning fluid in the system and consequently reduces the possibility of impurity contamination in an ultra-high purity feed system.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
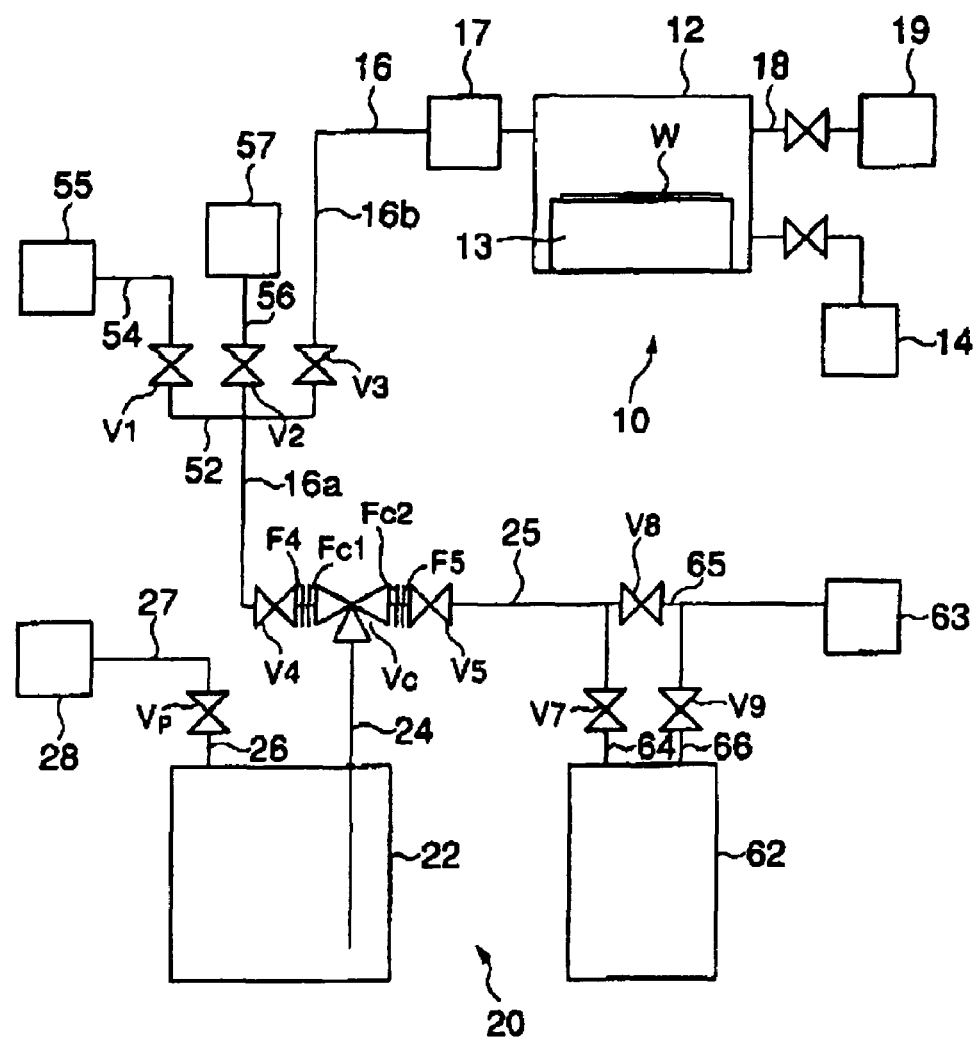
FIG. 1 illustrates the conduit layout in an MOCVD system that produces tantalum oxide film and that incorporates a source liquid supply apparatus.

The first aspect of the invention is a source liquid supply apparatus that is characteristically provided with a leaktight source tank that contains source liquid and that is provided with a discharge port for the output of said source liquid and a pressurization port for the introduction of pressurization gas for the pressure-delivery of said source liquid;

a pressurization gas conduit for the feed of the aforesaid pressurization gas into the source tank, wherein said pressurization gas conduit connects the aforesaid pressurization port and a source of pressurization gas;

a flow-switching mechanism that is attached to the aforesaid discharge port and which is provided with a first port, wherein said first port is connected to said discharge port, a second and third ports, which are connected to each other through an intermediate flow passage and which are connected to the first port, and a valve member that can produce an isolated state in which communication between the first port and the second and third ports is closed off while communication between the second and third ports is maintained;

a feed conduit that connects the second port to a prescribed facility in order to supply the aforesaid source liquid to said facility;

a cleaning fluid conduit that connects the aforesaid feed conduit with a source of cleaning fluid in order to feed cleaning fluid into the feed conduit;

a purge gas conduit that connects the feed conduit to a source of purge gas in order to feed purge gas into the feed conduit; and an exhaust conduit that connects to the third port and that, when the aforesaid isolated state is in place, exhausts the cleaning fluid and purge gas that have been introduced into the feed conduit, wherein said exhaust proceeds through the aforesaid second port, intermediate flow passage, and third port.

The second aspect of this invention comprises the apparatus of the first aspect with the characteristic features that the first, second, and third ports are each connected, through first, second, and third orifices, respectively, to a common compartment that functions as part of the intermediate flow passage, and the aforesaid valve member has the ability to close the first orifice while the second and third orifices remain open.

The third aspect of this invention comprises the apparatus of the first aspect with the characteristic features that the first port is connected through a first orifice to a common compartment that functions as part of the intermediate flow passage, the second and third ports are connected to each other through a connection that does not proceed through said common compartment and are connected to said common compartment through a common orifice, and the aforesaid valve member has the ability to close said common orifice.

The fourth aspect of this invention comprises an apparatus as described in any of the first through third aspects, with the characteristic feature that the aforesaid valve member is supported by a bellows or diaphragm that forms a part of the inner wall of the common compartment.

The fifth aspect of this invention comprises an apparatus as described in any of the first through fourth aspects, with the characteristic feature that a vacuum exhaust member is connected to the exhaust conduit.

The sixth aspect of this invention comprises an apparatus as described in any of the first through fifth aspects, with the characteristic features that a first mounting valve is disposed in the feed conduit in the vicinity of the second port, a second mounting valve is disposed in the exhaust conduit in the vicinity of the third port, and the flow-switching mechanism is detachable from said first and second mounting valves.

The seventh aspect of this invention comprises a method for detaching the source tank from the source liquid supply apparatus of the sixth aspect, said method being characteristically provided with a residual liquid discharge process, in which the exhaust conduit or source tank is depressurized and, utilizing the pressure difference produced by said depressurization, source liquid remaining within the feed conduit is discharged into the exhaust conduit or source tank; a cleaning process, which is carried out after the aforesaid residual liquid discharge process and in which, with the aforesaid isolated state being in place and the exhaust conduit closed, cleaning fluid is fed from the cleaning fluid conduit into the feed conduit so as to fill the interiors of the feed conduit, second port, intermediate flow passage, and third port with cleaning fluid, and in which the exhaust conduit is thereafter opened and the cleaning fluid is discharged into the exhaust conduit; a gas purge process, which is carried out after the aforesaid cleaning process and in which, with the aforesaid isolated state being in place and the exhaust conduit closed, purge gas is fed from the purge gas conduit into the feed conduit so as to fill the interiors of the feed conduit, second port, intermediate flow passage, and third port with purge gas, and in which the exhaust conduit is thereafter opened and the purge gas is discharged into the exhaust conduit; and a detachment process, which is carried out after the aforesaid purge process and in which the flow-switching mechanism and the source tank are together detached from the source liquid supply apparatus by detaching the flow-switching mechanism from the first and second mounting valves.

The eighth aspect of this invention comprises the method of the seventh aspect, which is characteristically additionally provided with a process which is carried out after the aforesaid detachment process and in which the feed conduit and exhaust conduit are interconnected through the first and second mounting valves and purge gas is flowed from the purge gas conduit through the feed conduit and into the exhaust conduit.

The ninth aspect of this invention comprises the method of the seventh or eighth aspect characterized by the repetition in the cleaning process of the feed operation in which cleaning fluid is fed into the feed conduit and a discharge operation in which cleaning fluid is discharged into the exhaust conduit by the feed of purge gas into the feed conduit.

The tenth aspect of this invention comprises the method of the ninth aspect characterized in that in the discharge operation the interior of the feed conduit is first pressurized to 0.1 to 1 MPa by the feed of purge gas with the exhaust conduit closed and the exhaust conduit is thereafter opened.

The eleventh aspect of this invention is a method for cleaning a target section of a feed conduit that connects a source tank with a prescribed facility for the purpose of feeding source liquid to said facility, said method being characteristically provided with a preparatory process, in which a state is set up in which
- a first valve is disposed at one of the two ends of said target section and a second valve is disposed at the other end, in order to thereby enable selective closure of the two ends of said target section,
- a cleaning fluid source and a purge gas source are connected to one side of said target section through, respectively, a cleaning fluid valve and a purge gas valve, for the purpose of feeding, respectively, cleaning fluid and purge gas thereinto, and
- a waste tank for the purpose of recovering waste liquid is connected through a waste valve to the other side of said target section;

a residual liquid discharge process, which is carried out after the preparatory process and in which source liquid remaining in the target section is discharged to the source tank or waste tank;

a cleaning process, which is carried out after the residual liquid discharge process and which comprises repetition of a feed operation in which cleaning fluid is fed into the target section with the waste valve closed and a discharge operation in which with the waste valve open the cleaning fluid is discharged into the waste tank while feeding purge gas; and a gas purge process, which is carried out after the cleaning process and in which the interior of the target section is subjected to a gas purge by the purge gas.

The twelfth aspect of this invention comprises the method according to the eleventh aspect characterized in that one of the aforesaid first and second valves is provided with a flow-switching mechanism that has
- a first port that is connected to the source tank,
- a second and third ports, which are connected to each other through an intermediate flow passage and which are connected to the first port, and
- a valve member that can produce an isolated state in which communication between the first port and the second and third ports is closed off while communication between the second and third ports is maintained, and in that said second port is connected through the target section to the aforesaid facility and the said third port is connected to the cleaning fluid source and the purge gas source or the waste tank.

The thirteenth aspect of this invention comprises the method according to the twelfth aspect characterized in that the first, second, and third ports are each connected, through first, second, and third orifices, respectively, to a common compartment that functions as part of the intermediate flow passage, and in that the aforesaid valve member has the ability to close the first orifice while the second and third orifices remain open.

The fourteenth aspect of this invention comprises a method according to any of the eleventh through thirteenth aspects characterized in that in the discharge operation the interior of the target section is first pressurized to 0.1 to 1 MPa by the feed of purge gas with the exhaust valve closed and the exhaust valve is thereafter opened.

The fifteenth aspect of this invention comprises a method according to any of the eleventh to fourteenth aspects, characterized in that the aforesaid cleaning process is provided with
- a cleaning fluid feed process, in which, with the purge gas valve, first and second valves, and waste valve closed, the cleaning fluid valve is opened and cleaning fluid is fed from the cleaning fluid source to the target section;
- a pressurization process, which follows the cleaning fluid feed process and in which, with the cleaning fluid valve, first and second valves, and waste valve closed, the purge gas valve is opened and the interior of the target section is pressurized to 0.1 to 1 MPa by the feed of purge gas from the purge gas source to the target section; and
- a discharge process, which follows the pressurization process and in which, with the cleaning fluid valve and first and second valves closed and with the purge gas valve open, the waste valve is opened and the cleaning fluid is discharged into the waste tank while purge gas is supplied.

The sixteenth aspect of this invention comprises a method according to any of the eleventh to fifteenth aspects, said method being characterized in that in the cleaning process the interior of the target section is brought into a reduced pressure state prior to feed of the cleaning fluid into the target section.

The seventeenth aspect of this invention comprises a method according to any of the eleventh to sixteenth aspects, said method being characterized in that cleaning fluid pressurized to 0.1 to 1 MPa is fed into the target section in the cleaning process.

The embodiments of this invention explore a variety of executions of this invention, and various embodiments of this invention can be derived by suitable combination of the plural number of disclosed constituent elements. For example, when an embodiment of the invention has been derived in which some constituent elements have been omitted from the overall set of constituent elements presented for the embodiment, these omitted elements can be suitably fulfilled by conventional well-known technologies in the actual working of the derived inventive embodiment.

EMBODIMENTS OF THE INVENTION

Embodiments of this invention are explained below with reference to the drawings. In the description that follows, constituent elements that have approximately the same structure and function are assigned the same reference symbol and their description will be repeated only when necessary.

FIG. 1 contains a schematic drawing of the conduit layout in an MOCVD system that produces tantalum oxide ($Ta_2O_5$) film. This MOCVD system incorporates a source liquid supply apparatus that is an embodiment of this invention. More specifically, this system is provided with an MOCVD apparatus 10 and a source liquid supply apparatus 20.

The MOCVD apparatus 10 contains a leaktight process compartment 12, in the interior of which is disposed a susceptor 13 that can hold, support, and heat a semiconductor wafer W. The process compartment 12 is connected to a vacuum exhaust member 14 that can exhaust the interior of the process compartment 12 and can establish a vacuum therein. The process compartment 12 is also connected to a feed conduit 16 that can supply PET (pentaethoxytantalum: $Ta(OC_2H_5)_5$=the tantalum source liquid) and to a feed conduit 18 that can supply, for example, $O_2$ (oxidizer). Said feed conduit 16 is connected to a source liquid supply apparatus 20 that is an embodiment of this invention, while said feed conduit 18 is connected to an $O_2$ source 19. A vaporizer 17 is disposed directly upstream from the process compartment 12 in the feed conduit 16; this vaporizer 17 functions to vaporize the PET.

The source liquid supply apparatus 20 contains a leaktight source tank 22 that holds the PET source liquid. There are disposed on the source tank 22 a discharge port conduit 24 for delivery of the source liquid and a pressurization port conduit 26 for introducing pressurization gas for the pressure-delivery of the source liquid. This pressurization port conduit 26 is connected to a pressurization gas source 28 that can supply an inert gas, e.g., helium, through a pressurization gas conduit 27 itself provided with a valve Vp. A flow-switching mechanism Vc (first valve) is connected to the discharge port conduit 24.

Figure 2:
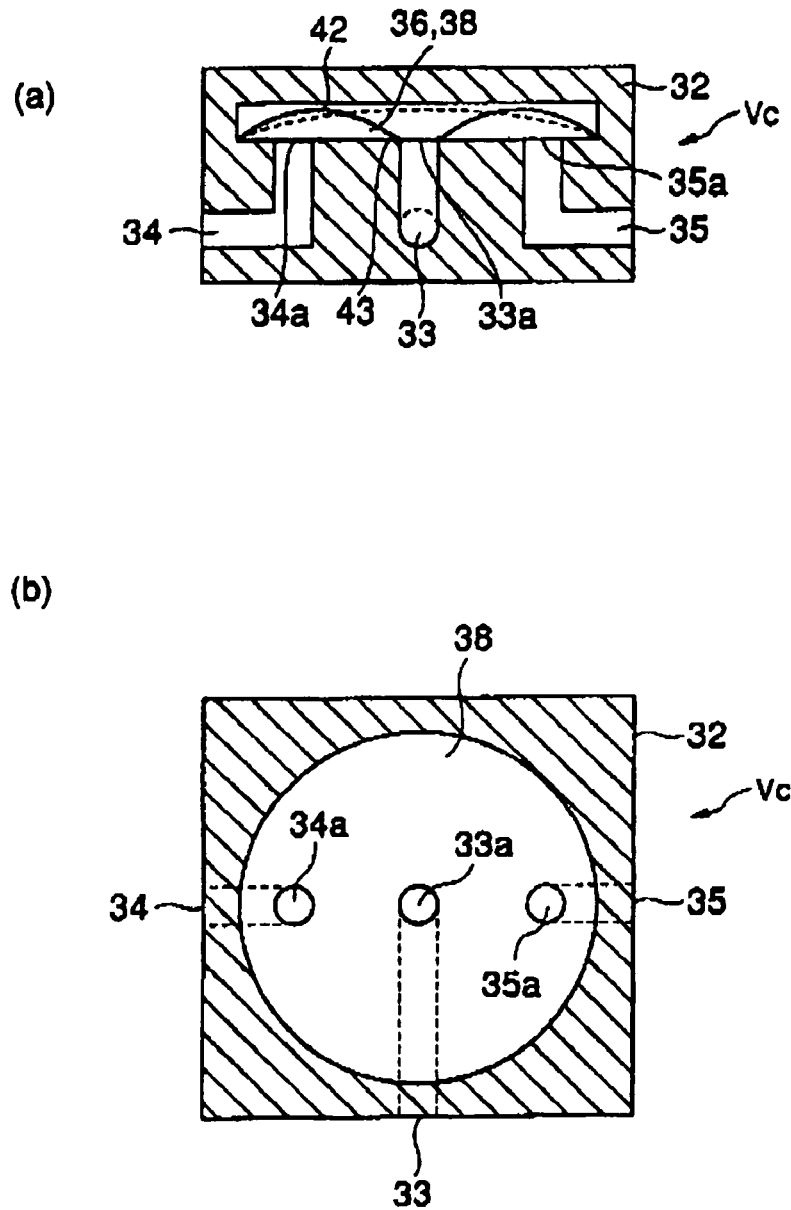
FIG. 2(a) illustrates a vertical cross-section of the internal structure of the flow-switching mechanism.
FIG. 2(b) illustrates a horizontal cross-section of the internal structure of the flow-switching mechanism.

FIGS. 2(a) and 2(b) contain, respectively, vertical and horizontal cross-sectional drawings that schematically illustrate the internal structure of the flow-switching mechanism Vc. As shown, the flow-switching mechanism Vc contains a first port 33, a second port 34, and a third port 35 formed within a leaktight casing 32 and contains an intermediate flow passage 36 that interconnects said ports. A common compartment 38 is elaborated as part of the intermediate flow passage 36, and the first, second, and third ports 33, 34, and 35 are connected, through first, second, and third orifices 33a, 34a, and 35a, respectively, to the common compartment 38.

The ceiling of the common compartment 38 is defined by the diaphragm 42, while the center of the diaphragm 42 is structured as a valve member 43 that can open and close the first orifice 33a of the first port 33. The diaphragm 42 is driven up-and-down by a spindle (not shown) disposed on the top thereof, and the valve member 43 is opened and closed accompanying the up-and-down movement of the diaphragm 42. The valve member 43 can effect opening (position indicated by the dashed line in FIG. 2(a)) and closure (position indicated by the solid line in FIG. 2(a)) of the first orifice 33a while the second orifice 34a and the third orifice 35a remain open. In other words, when the valve member 43 is in the position indicated by the solid line in FIG. 2(a), the second port 34 and the third port 35 are in communication with each other through the common compartment 38 while communication between the first port 33 and the second port 34 and third port 35 is cut off (closed state=isolated state).

Usable as the flow-switching mechanism Vc are the DF series, multivalve manifold, 6LV-F5V (product of the NUPRO Co.) and the Mega 1 series, direct diaphragm valve, FUDDFTRO-71G (product of Kabushiki Kaisha Fujikin).

The discharge port conduit 24 of the source tank 22 is connected to the first port 33, while the second port 34 is connected to the upstream section 16a of the feed conduit 16 that supplies the PET source liquid. The third port 35 is connected to an exhaust conduit 25 for the discharge of the fluid within the feed conduit 16. A valve V4 is disposed in the upstream section 16a of the feed conduit in the vicinity of the second port 34, while a valve V5 is disposed in the exhaust conduit 25 in the vicinity of the third port 35. Flanges Fc1 and Fc2 are respectively provided on the second and third ports 34 and 35 and flanges F4 and F5 are respectively provided on valves V4 and V5 so as to render the flow-switching mechanism Vc attachable to and detachable from the valves V4 and V5.

The upstream section 16a of the feed conduit is connected to the downstream section 16b of the feed conduit through a manifold 52. This manifold 52 is connected through a cleaning fluid conduit 54 to a cleaning fluid source 55 that can supply cleaning fluid for dissolution of residues originating with the PET; this cleaning fluid is a suitable solvent such as an alcohol, ketone, or ether. The manifold 52 is also connected through a purge gas conduit 56 to a purge gas source 57 that can supply an inert gas such as nitrogen. The manifold 52 is connected to the conduits 54, 56, and 16b through valves V1, V2, and V3 (V3=second valve), respectively.

The exhaust conduit 25 is connected to a waste tank 62 for the recovery of waste solutions and to a vacuum exhaust member 63 that is capable of depressurizing and exhausting the interior of the exhaust conduit 25. Two port conduits 64 and 66 are disposed on the waste tank 62; these two port conduits 64 and 66 are connected to one another through the bypass conduit 65. The exhaust conduit 25 is connected to one end of the bypass conduit 65, while the vacuum exhaust member 63 is connected to the other end of the bypass conduit 65. Valves V7, V8, and V9 are disposed, respectively, in the conduits 64, 65, and 66.

Figure 3:
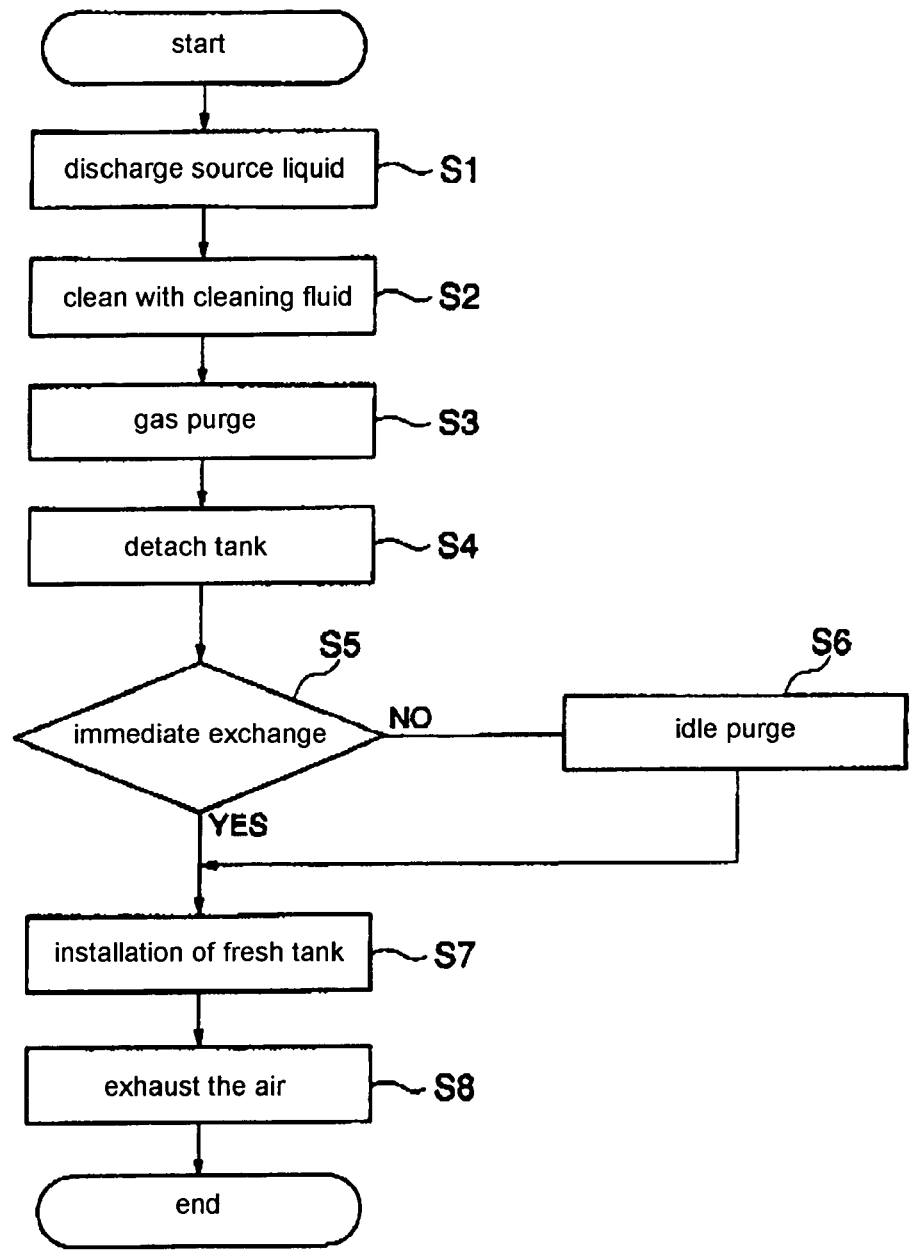
FIG. 3 illustrates the sequence for exchanging the source tank using exemplary embodiments of the inventive method for cleaning a source liquid feed conduit and the inventive method for detaching the source tank.

An embodiment of the inventive method for cleaning the source liquid feed conduit and an embodiment of the inventive method for detaching the source tank will now be explained with reference to the source liquid supply apparatus 20 in FIG. 1. FIG. 3 contains a flow chart that lays out the sequence for changing out the source tank using the inventive methods.

During a typical treatment the valves Vp, Vc, V4, and V3 will be open while all the other valves will be closed. Under these circumstances, pressurization gas is introduced into the source tank 22 through the pressurization port conduit 26, which results in source liquid transport out of the discharge port conduit 24 and supply of PET (source liquid) through the feed conduit 16 into the MOCVD apparatus 10.

The sequence outlined below is followed when it is desired to detach the source tank 22, for example, in order to exchange the source tank 22. It is assumed in the explanation that follows that all the valves are initially set to the state corresponding to typical treatment as specified above (valves Vp, Vc, V4, and V3=open, all other valves=closed).

The source liquid remaining in the feed conduit 16 is first discharged (process S1).

This process is initiated with the following operations: the valves V9 and V7 are opened and the valves V3 and Vc are closed (the valve V5 is also in a closed state at this point) and the waste tank 62 and exhaust conduit 25 are depressurized by the vacuum exhaust member 63. The valve V5 is then opened and, due to the pressure difference generated by the depressurization operation between the upstream section 16a of the feed conduit and the waste tank 62 and exhaust conduit 25, source liquid remaining in said upstream section 16a of the feed conduit is recovered into the waste tank 62 through the exhaust conduit 25. As necessary this process is repeated until the source liquid in the upstream section 16a of the feed conduit has been completely recovered.

The depressurization operation performed on the waste tank 62 and exhaust conduit 25—an operation which is necessary for the discharge of residual source liquid—can be carried out as a preliminary step during typical treatment, or the waste tank 62 and exhaust conduit 25 can be continuously maintained under reduced pressure (except during detachment of the source tank 22). In addition, opening and closing of the valves V2 and V5 can be repeated during source liquid recovery in order to also utilize purge gas fed from the purge gas source 57 for source liquid recovery.

The source liquid may also be recovered into the source tank 22 rather than the waste tank 62. In this case, the source tank 22 is first depressurized by a suitable means and the valve Vc is then opened and source liquid is recovered into the source tank 22 utilizing the pressure difference between the source tank 22 and the upstream section 16a of the feed conduit. Although not shown, configurations that would enable depressurization of the source tank 22 are, for example, connection of a valve-equipped vent conduit or a vacuum exhaust member to the pressurization gas conduit 27.

The interior of the flow-switching mechanism Vc is then cleaned with cleaning fluid (process S2).

This process is begun as follows: the valve V1 is opened and the valve V5 is closed (the valves V2, V3, and Vc are also in a closed state at this point) and the upstream section 16a of the feed conduit and the second and third ports 34 and 35 and common compartment 38 of the flow-switching mechanism Vc are filled with cleaning fluid supplied from the cleaning fluid source 55. This condition is maintained for a period of time suitable for dissolution of PET-originating residues, for example, 30 seconds. The valve V1 is then closed and the valves V2 and V5 are opened and, utilizing purge gas supplied from the purge gas source 57, the loaded cleaning fluid is recovered into the waste tank 62 through the exhaust conduit 25. This procedure is repeated until the residues within the second and third ports 34 and 35 and common compartment 38 of the flow-switching mechanism Vc are entirely cleaned out.

The interior of the flow-switching mechanism Vc is then purged with gas (process S3).

This process is begun as follows: the valve V2 is opened and the valve V5 is closed (the valves V1, V3, and Vc are also in a closed state at this point) and the upstream section 16a of the feed conduit and the second and third ports 34 and 35 and common compartment 38 of the flow-switching mechanism Vc are filled with purge gas supplied from the purge gas source 57. The valve V2 is then closed and subsequent thereto the valve V5 is opened and the purge gas is discharged through the exhaust conduit 25. This procedure is repeated until there are no traces of cleaning fluid remaining within the second and third ports 34 and 35 and common compartment 38 of the flow-switching mechanism Vc.

The source tank 22 is then detached (process S4).

This process commences with the opening of the valve V2 and, while purge gas is flowing from the purge gas source 57 in the upstream section 16a of the feed conduit, closing the valves V4 and V5. The connections between the flanges F4 and F5 on the valves V4 and V5 and the flanges Fc1 and Fc2 on the flow-switching mechanism Vc are then released and the source tank 22 and the flow-switching mechanism Vc are together detached from the valves V4 and V5, that is, from the source liquid supply apparatus 20.

When the source tank 22 is to remain detached for some period of time (NO in process S5), it will be desirable for the valves V4 and V5 to be connected to each other, either directly or through a connection unit. In addition, an idle purge (process S6) should be maintained within the upstream section 16a of the feed conduit by opening valves V2, V4, V5, and V8, closing valves V7 and V9, and feeding purge gas from the purge gas source 57. This can prevent the introduction of air into the upstream section 16a of the feed conduit during detachment of the source tank 22. When, on the other hand, a fresh source tank 22 provided with its own flow-switching mechanism Vc has already been set up at the time point at which the spent source tank 22 is detached, an immediate exchange of the source tanks can be carried out (YES in process S5).

With the valves V4 and V5 closed, a fresh source tank 22 is installed between said valves V4 and V5 (process S7). The valve V5 is then opened with the flow-switching mechanism Vc remaining closed, and the air that has infiltrated between the valves V4 and V5 during installation is exhausted through the exhaust conduit 25 (process S8). The shift is then made to the typical treatment in which PET is fed from the fresh source tank 22 to the MOCVD apparatus 10 based on the demand by the MOCVD apparatus 10. This shift to the typical treatment can be preceded, as necessary or desired, by cleaning/discharge/purge/vacuum exhaust of the interior of the upstream section 16a of the feed conduit.

The conduit diagram in FIG. 1 simply depicts an example, in which in particular the valves are represented in terms of their functionality. The valves are therefore not limited to particular types. For example, the functions of the valves V4 and V5 can be built into the flow-switching mechanism Vc, while other conduit sections can be modified as shown in FIGS. 4 and 5.

Figure 4:
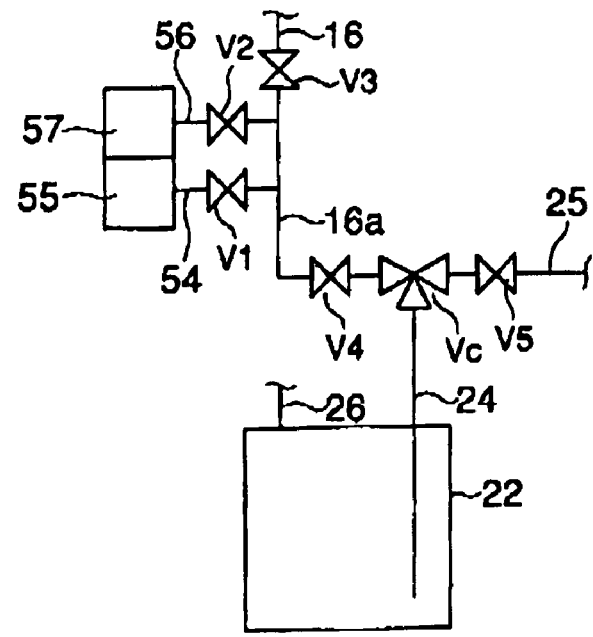
FIG. 4 illustrates an embodiment of a source liquid supply apparatus.

FIG. 4 contains a conduit diagram that schematically illustrates a source liquid supply apparatus that is another embodiment of this invention. The apparatus in this embodiment differs from the apparatus in FIG. 1 by not using the manifold 52 to connect the cleaning fluid source 55 and the purge gas source 57 to the feed conduit 16. Specifically, the cleaning fluid conduit 54 and the purge gas conduit 56 are connected in this case to the feed conduit 16 through the usual two-way valves V1 and V2.

Figure 5:
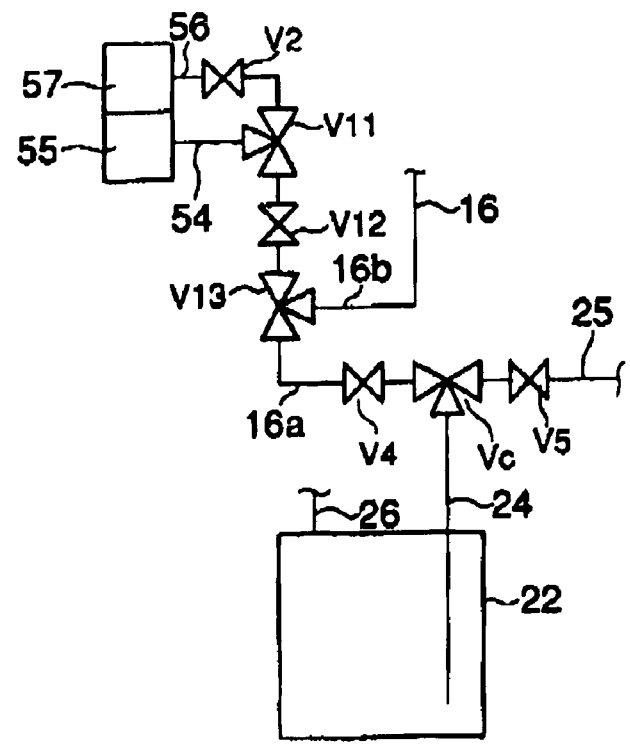
FIG. 5 illustrates a second embodiment of a source liquid supply apparatus.

FIG. 5 contains a conduit diagram that schematically illustrates a source liquid supply apparatus that is yet another embodiment of this invention. The apparatus in this embodiment differs from the apparatus in FIG. 1 by using two three-way valves V11 and V13 (V13=second valve) instead of the manifold 52 in order to connect the cleaning fluid source 55 and the purge gas source 57 to the feed conduit 16. Specifically, the cleaning fluid conduit 54 and the purge gas conduit 56 are connected to each other through two ports of the three-way valve V11. The one remaining port on the three-way valve V11 is connected across the valve 12 to one port on the three-way valve V13. The two remaining ports on the three-way valve V13 are used to connect the upstream section 16a of the feed conduit with the downstream section 16b of the feed conduit. The flow-switching mechanism Vc illustrated in FIGS. 2(a) and (b) can be used as a three-way valve V11 or V13.

Figure 6:
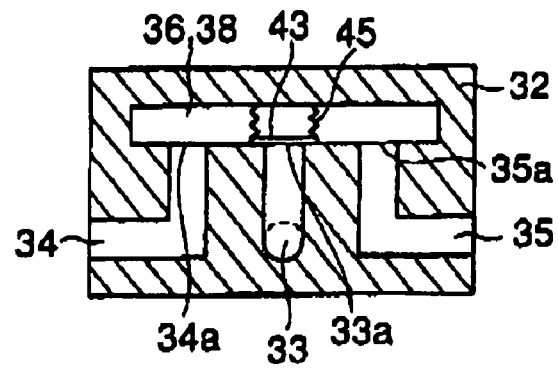
FIG. 6 illustrates a vertical cross section of a modified example of a flow-switching mechanism.

FIG. 6 contains a vertical cross section that illustrates a modified example of the flow-switching mechanism Vc that is another embodiment of this invention. The mechanism in this embodiment differs from the mechanism in FIG. 2 by the use of a bellows 45 in place of the diaphragm 42. In this case, the end of a bellows 45 bears the valve member 43 for opening/closing the first orifice 33a of the first port 33 that connects to the source tank 22. This valve member 43 effects opening and closing of the first port 33 accompanying the expansion and contraction of the bellows 45.

Figure 7:
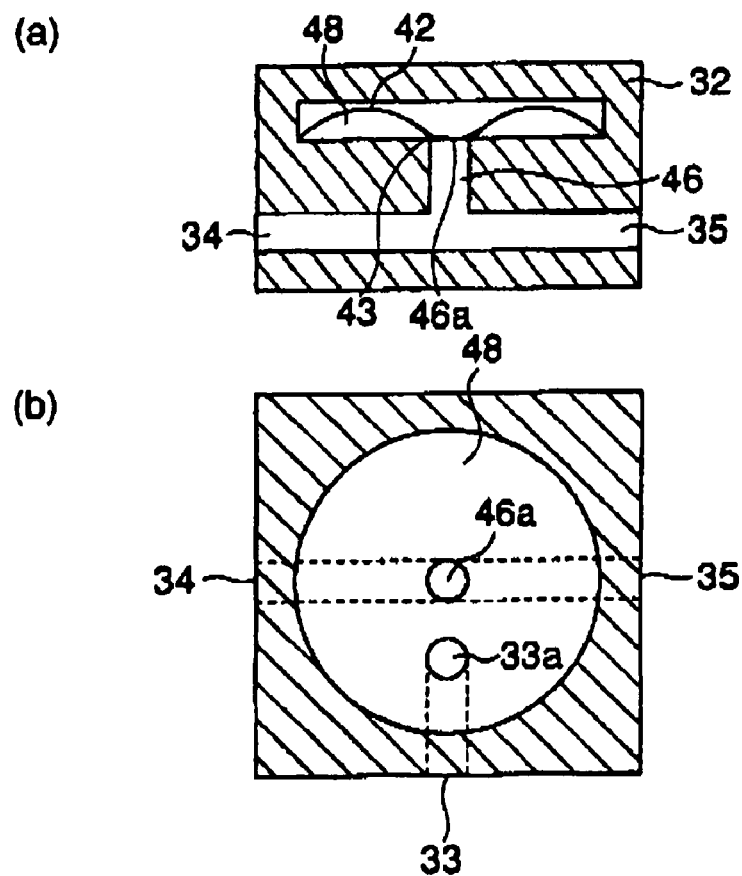
FIG. 7(a) illustrates a vertical cross-section of a flow-switching mechanism.
FIG. 7(b) illustrates a horizontal cross-section of a flow-switching mechanism.

FIGS. 7(a) and (b) contain, respectively, a vertical cross section and a horizontal cross section that illustrate another modified example of the flow-switching mechanism Vc that is yet another embodiment of this invention. In the mechanism of this embodiment, the first port 33 (connected to the source tank 22) is connected through a first orifice 33a to a common compartment 48 that functions as part of the intermediate flow passage 46. The second and third ports 34 and 35, which are respectively connected to the feed conduit 16 and the exhaust conduit 25, are connected to each other through a connection that does not proceed through the common compartment 48 and are connected to the common compartment 48 by a common orifice 46a. The valve member 43, by closing off the common orifice 46a, closes off the communication between the first port 33 and the second and third ports 34 and 35 (closed state=isolated state). A bellows can also be used in this case for actuation of the valve member 43 instead of the diaphragm 42.

Figure 8:
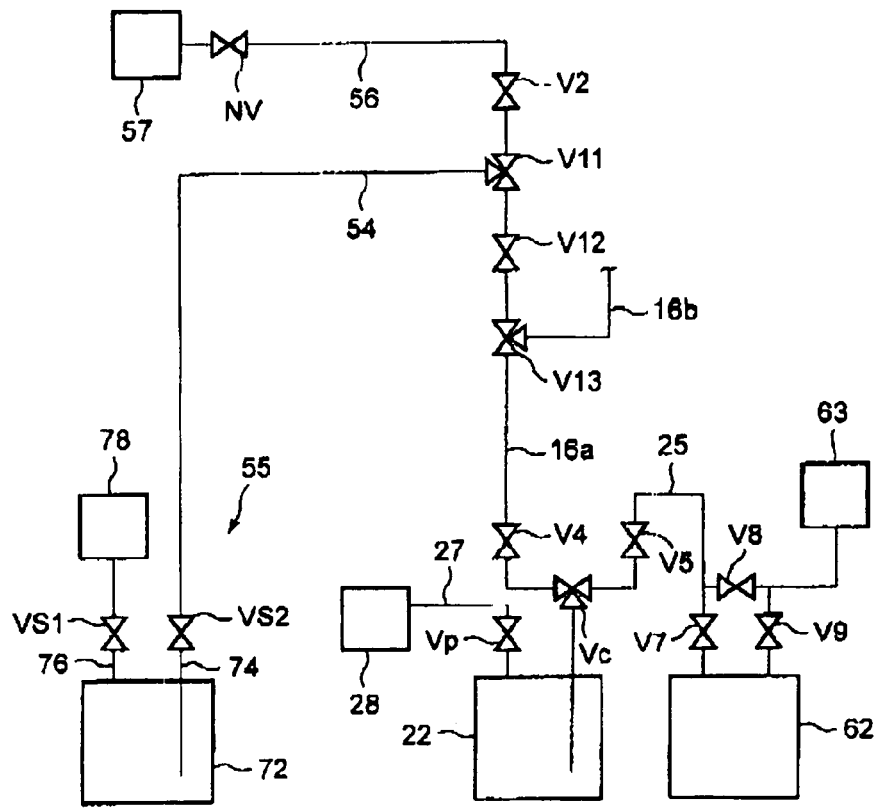
FIG. 8 illustrates a third embodiment of a source liquid supply apparatus.

FIG. 8 contains a conduit diagram that schematically illustrates a source liquid supply apparatus that is yet another embodiment of this invention. The apparatus in this embodiment, while having almost the same structure as the apparatus illustrated in FIG. 5, additionally illustrates a cleaning fluid source 55 that employs gas pressure delivery. A needle valve NV is also disposed between the valve V2 and the purge gas source 57 for the purpose of controlling the gas flow rate in the purge gas conduit 56. A flow-switching mechanism as illustrated in FIGS. 2(a) and (b) is used as the three-way valve V11 and as the three-way valve V13.

Specifically, the cleaning fluid source 55 contains a leak-tight cleaning fluid tank 72 that holds ethanol for cleaning out PET (source liquid). There are disposed on this cleaning fluid tank 72 a discharge port conduit 74 for delivery of the source liquid and a pressurization port conduit 76 for introducing pressurization gas for the pressure-delivery of the source liquid. This pressurization port conduit 76 is connected to a pressurization gas source 78 that can supply an inert gas, e.g., helium, through a pressurization gas conduit 77 itself provided with a valve VS1. The discharge port conduit 74 is connected to the cleaning fluid conduit 54 through a valve VS2.

Figure 10:
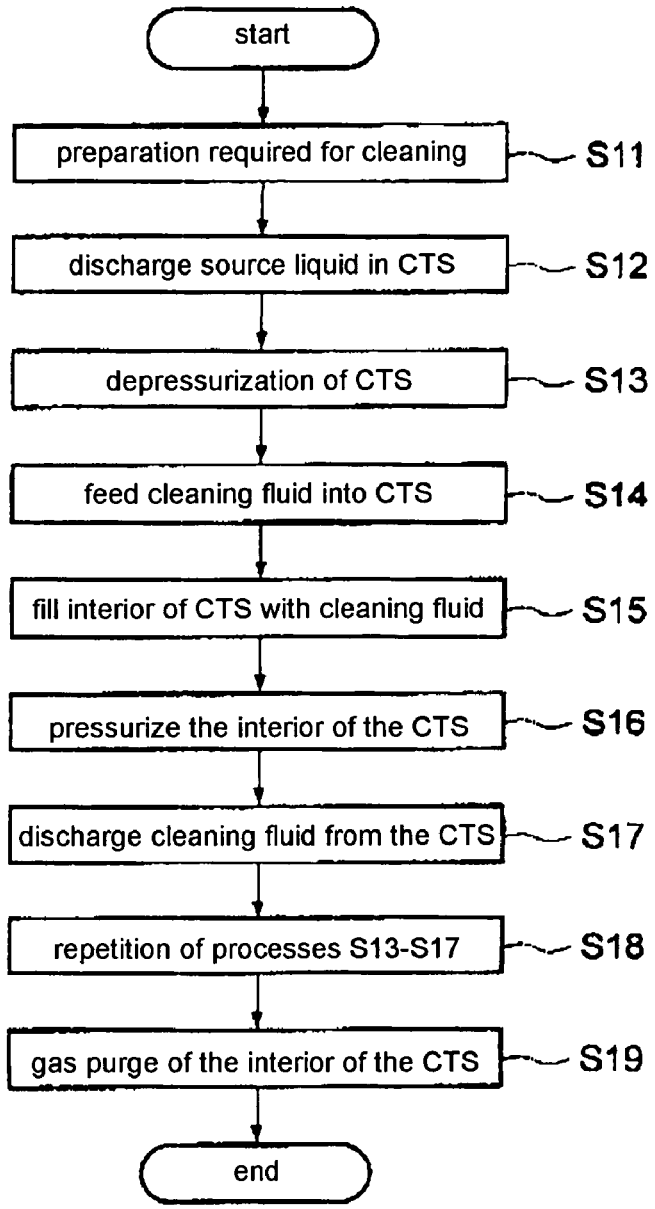
FIG. 10 illustrates the sequence of an exemplary embodiment of the inventive method for cleaning a source liquid feed conduit.

Another embodiment of the inventive method for cleaning a source liquid feed conduit will now be explained with reference to the source liquid supply apparatus illustrated in FIG. 8. FIG. 10 contains a flow chart that lays out the sequence of this method. The cleaning target section in this case comprises the upstream section 16a of the feed conduit and valves Vc, V4, V5, V12, and V13.

The set up or preparation required to carry out cleaning is first performed (process S11).

In the embodiment under consideration, valves Vc and V13 (the first and second valves) are provided as preparatory elements required for cleaning; these valves are disposed so as to enable selective closure of the two ends of the target section, i.e., the upstream section 16a of the feed conduit. A cleaning fluid source 55 and a purge gas source 57 are also connected, respectively through a cleaning fluid valve V11 and a purge gas valve V2, on one side of the target section (the upstream section 16a of the feed conduit) for the purpose of supplying, respectively, cleaning fluid and purge gas. A waste tank 62 is connected through a waste valve V5 on the other side of the target section (the upstream section 16a of the feed conduit) for the purpose of recovering waste liquid. In the embodiment under consideration these preparatory elements were incorporated into the source liquid supply apparatus when the apparatus was set up. The cleaning fluid source 55, purge gas source 57, and waste tank 62, however, may be connected to the cleaning target section just during cleaning.

The sequence outlined below is followed when it is desired to clean the feed conduit 16 on the occasion of, for example, exchanging the source tank 22. The initial settings here are as follows: after all the valves have been closed, the valves VS1 and VS2 are opened and the needle valve NV is set so as to give a flow rate of 10-100 L/min at atmospheric pressure.

In the case of the valves V11, V13, and Vc, the closed condition denotes a condition, as illustrated by the solid line in FIG. 2(a), in which the first port 33 is closed off from the second and third ports 34 and 35 while communication is maintained between the second and third ports 34 and 35. Thus, the closed valve V11 resides in a state in which the line to the cleaning fluid source 55 is closed off from the upstream section 16a of the feed conduit while the line to the purge gas source 57 communicates with the upstream section 16a of the feed conduit. The closed valve V13 resides in a state in which the line to the MOCVD apparatus 10 is closed off from the upstream section 16a of the feed conduit while the line to the cleaning fluid source 55 and purge gas source 57 communicates with the upstream section 16a of the feed conduit. The closed valve Vc resides in a state in which the line to the source tank 22 is closed off from the upstream section 16a of the feed conduit while the line to the waste tank 62 communicates with the upstream section 16a of the feed conduit.

Residual source liquid in the cleaning target section is first discharged (process S12).

The valves V9, V7, V2, V12, V4, and V5 are opened in this process in the given sequence in order to feed purge gas from the purge gas source 57 into the cleaning target section (upstream section 16a of the feed conduit) and conduct a vacuum exhaust on the same section using the vacuum exhaust member 63. Utilizing the purge gas this functions to recover source liquid remaining in the upstream section 16a of the feed conduit through the exhaust conduit 25 to the waste tank 62.

Recovery of the source liquid can also be effected by performing a preliminary depressurization of the waste tank 62 and exhaust conduit 25 using the vacuum exhaust member 63 and then utilizing the pressure difference between the upstream section 16a of the feed conduit and the waste tank 62 and exhaust conduit 25.

The source liquid can also be recovered to the source tank 22 rather than to the waste tank 62. In such a case, the source tank 22 is first depressurized by a suitable means and the source liquid is then recovered to the source tank 22 by opening Vc and utilizing the pressure difference between the upstream section 16a of the feed conduit and the waste tank 22. Although not shown, configurations that would enable depressurization of the source tank 22 are, for example, connection of a valve-equipped vent conduit or a vacuum exhaust member to the pressurization gas conduit 27.

The interior of the cleaning target section is then depressurized (process S13).

In this process, the vacuum exhaust member 63 remains in operation while only the valve V2 is closed relative to the situation in the above-described process S12; this condition is maintained for 1 to 100 seconds. As a consequence, the interior of the upstream section 16a of the feed conduit is depressurized by the vacuum exhaust member 63 to 1 to 30 kPa and preferably to around the vapor pressure of the cleaning fluid at ambient temperature (5.8 kPa at 20° C. for ethanol).

Cleaning fluid is then fed into the interior of the cleaning target section (process S14).

Relative to the situation in the above-described process S13, the valve V5 is closed and the valve V11 is opened in the instant process, and as a consequence cleaning fluid is fed from the cleaning fluid source 55 into the upstream section 16a of the feed conduit. At this point, the cleaning fluid can as necessary or desired be fed pressurized to 0.1-1 MPa and preferably 0.3-0.7 MPa by inert gas from the pressurization gas source 78. The depressurization of the interior of the upstream section 16a of the feed conduit and additional optional pressurization of the cleaning fluid causes the cleaning fluid to flow very forcefully into the interior of the upstream section 16a of the feed conduit, with the result that its mechanical scouring action can scrape off material adhering on the inner wall of the conduit 16a.

A state is then set up in which the interior of the cleaning target section is filled with cleaning fluid (process S15).

After the valve V11 has been opened in process S14 and 1 to 10 seconds have been allowed to elapse, the valve V11 is closed in the instant process and a period of quiescence is begun. This sets up a state in which the upstream section 16a of the feed conduit, etc., is filled by the cleaning fluid fed from the cleaning fluid source 55. This state is maintained for 1 to 100 seconds for a time suitable for dissolution of PET-derived residues, for example, 30 seconds.

The interior of the cleaning target section is then pressurized (process S16).

Relative to the situation in the above-described process S15, the valve V2 is opened in the instant process, resulting in the feed of purge gas from the purge gas source 57 into the upstream section 16a of the feed conduit. The interior of the upstream section 16a of the feed conduit is thereby pressurized by the purge gas to 0.1-1 MPa and preferably 0.5-1 MPa. This pressure is preferably higher than the pressure of the cleaning fluid in order to prevent back flow of the cleaning fluid.

The cleaning fluid is then discharged from the cleaning target section (process S17).

Relative to the situation in the above-described process S16, the valve V5 is opened in the instant process, resulting in recovery of the spent cleaning fluid in the upstream section 16a of the feed conduit through the exhaust conduit 25 to the waste tank 62. At this point, the waste tank 62 and exhaust conduit 25 can, as necessary or desired, have been preliminarily depressurized by the vacuum exhaust member 63 to 1-30 kPa and preferably to around the vapor pressure of the cleaning fluid at ambient temperature. This pressurization of the interior of the upstream section 16a of the feed conduit and additional optional preliminary depressurization of the waste tank 62 side causes the cleaning fluid to flow very forcefully from the upstream section 16a of the feed conduit, with the result that its mechanical scouring action can scrape off material adhering on the inner wall of the conduit 16a.

Processes S13 to S17 are then repeated (process S18).

The above-described processes S13 to S17 are repeated, for example, for a total of 3 to 100 times and preferably 5 to 20 times, until the residues in the common compartment 38 have been completely cleaned out and removed. Specifically, in the embodiment under consideration the treatment comprising, inter alia, feed of cleaning fluid and purge gas into the cleaning target section (upstream section 16a of the feed conduit) and vacuum exhaust thereof is run repeatedly as a batch treatment. During this sequence, pressure is applied to the feed and discharge of the cleaning fluid as described above in order to impart a mechanical action to the cleaning fluid. This makes it possible in the embodiment under consideration to conduct an effective cleaning using small amounts of cleaning fluid.

The interior of the cleaning target section is then subjected to a gas purge (process S19).

Relative to the above-described process S17, the valves V5, V7, and V9 are closed in the instant process, thereby elaborating a state in which the upstream section 16a of the feed conduit, etc., is filled by purge gas fed from the purge gas source 57. The valve V2 is then closed and the valves V5 and V8 are thereafter opened, resulting in discharge of the purge gas through the exhaust conduit 25. This procedure is repeated until no traces of cleaning fluid remain in the upstream section 16a of the feed conduit.

Then, as necessary the source tank 22 can be detached and switched out for a fresh source tank. The details of the corresponding operations are omitted here since these operations are substantially the same as those described above with reference to processes S4 to S8.

EXAMPLES

Figure 9:
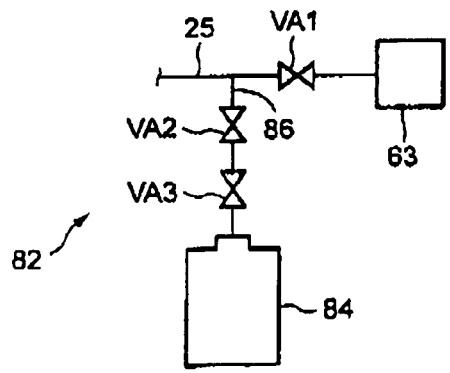
FIG. 9 illustrates the structure of a sampling section that was incorporated in place of the waste tank structure in experiments carried out using the apparatus illustrated in FIG. 8.

Cleaning treatment experiments were run using the source liquid supply apparatus illustrated in FIG. 8. In this experiment, however, the sampling section illustrated in FIG. 9 was used instead of the waste tank 62 structure illustrated in FIG. 8. As illustrated in FIG. 9, an exchangeable sampling section 82 is provided with a sampling bottle 84 that is connected to a port conduit 86 that branches from the exhaust conduit 25. A valve VA1 is disposed in the exhaust conduit 25 and a valve VA2 and needle valve VA3 are disposed in the port conduit 86.

The conduit section 16a comprising the cleaning target section in these experiments was made of stainless steel (SS316L) and had an outside diameter of 6.35 mm, a wall thickness of 1 mm, an electropolished interior surface, and a length of 1,000 mm. The source liquid was 99.9999% pure PET, the cleaning fluid was ethanol, the purge gas was high-purity nitrogen, and the source liquid pressurization gas was high-purity helium.

In the case of example EB (batch treatment), which is an embodiment of this invention, apparatus set up and discharge of residual PET in the conduit section 16a were first carried out according to processes S11 and S12 as described above. The interior of the conduit section 16a was then depressurized to 6.5 kPa by the vacuum exhaust member 63 (process S13). This was followed by the supply of ethanol pressurized to 0.3 MPa into the conduit section 16a (process S14) and then by standing for 5 seconds (process S15). The interior of the conduit section 16a was subsequently pressurized to 0.6 MPa by $N_2$ gas (process S16), after which valves V5, VA2, and VA3 (see FIGS. 8 and 9) were opened (process S17) and the pressurized ethanol was recovered to the sampling bottle 84 (see FIG. 9). This cycle of processes S13 to S17 was repeated for a total of ten times. The Ta concentration in the 20 cm$^3$ of recovered ethanol was analyzed in each cycle by inductively coupled plasma-mass spectrometry (ICP-MS).

In the case of comparative example EC (continuous treatment), apparatus set up and discharge of residual PET in the conduit section 16a were first carried out according to processes S11 and S12 as described above. Ethanol pressurized to 0.3 MPa was then fed into the conduit section 16a and by adjusting the valve VA3 a continuous ethanol flow having a flow rate of 20 cm$^3$/min was produced in the conduit section 16a. The ethanol discharged from the conduit section 16a was recovered at the outlet from the valve VA3 (see FIG. 9) while changing the bottle 84 at 1-minute intervals. The Ta concentration in the 20 cm$^3$ of ethanol recovered in each bottle 84 was analyzed by ICP-MS.

Figure 11:
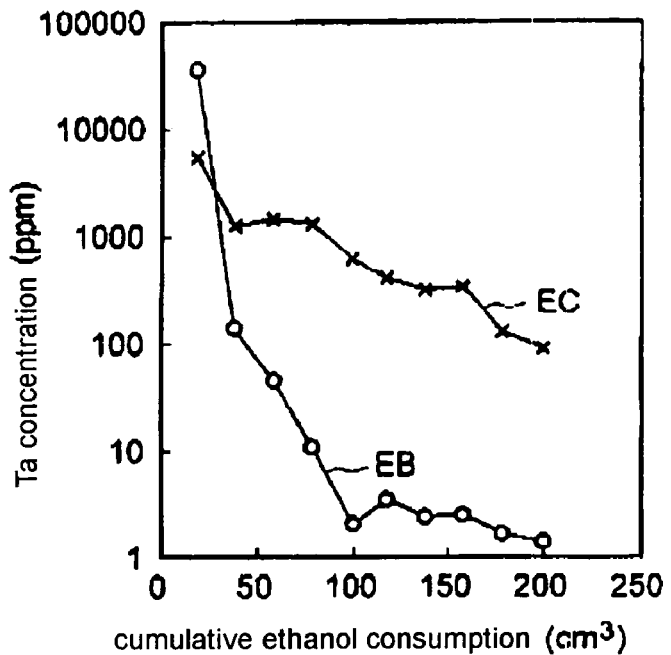
FIG. 11 compares the cleaning efficacy of a comparative example EC (continuous treatment) and an example EB (batch treatment) that is an exemplary embodiment of this invention.

The results of the experiments are reported in the graph in FIG. 11, where the x-axis plots the cumulative ethanol consumption in cm$^3$ and the y-axis plots the Ta concentration in ppm. In FIG. 3, the experimental results for example EB (batch treatment) are reported with an open circle while the experimental results for comparative example EC (continuous treatment) are reported with an "x". As shown in FIG. 3, the decline in Ta concentration as a function of the cumulative ethanol consumption was much greater in example EB than in comparative example EC. More specifically, it is demonstrated that example EB enables an effective cleaning to be performed using less cleaning fluid than in comparative example EC.

FIGS. 12 through 16 contain conduit diagrams that in each instance schematically illustrate a source liquid supply apparatus that is another embodiment of this invention. The apparatuses in these embodiments correspond to modifications of the apparatus illustrated in FIG. 8. These apparatuses can be cleaned by carrying out the above-described processes S11 through S19.

Figure 12:
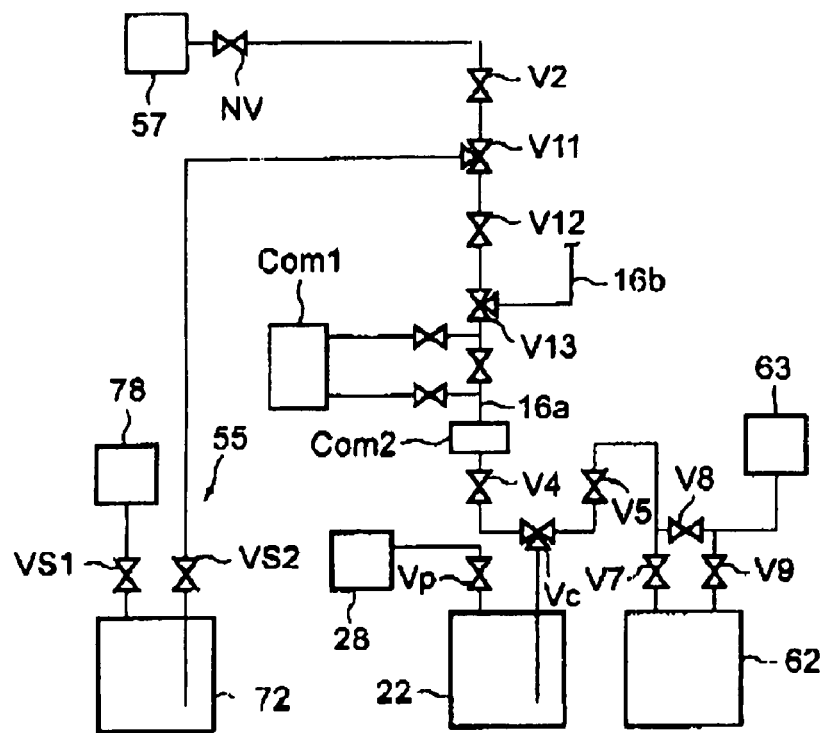
FIG. 12 illustrates a fourth embodiment of a source liquid supply apparatus.

In the apparatus illustrated in FIG. 12, the structural member Com1, which should not be exposed to cleaning fluid, has been preliminarily installed so as to enable it to reside in a bypass from the conduit section that is the cleaning target. This structural member Com1 can be exemplified by a liquid mass flow controller (MFC), orifice, needle valve, check valve, pressure controller, and filter. However, the structural member Com2, for example, a valve or pressure sensor, is cleaned along with the conduit section that is the cleaning target.

Figure 13:
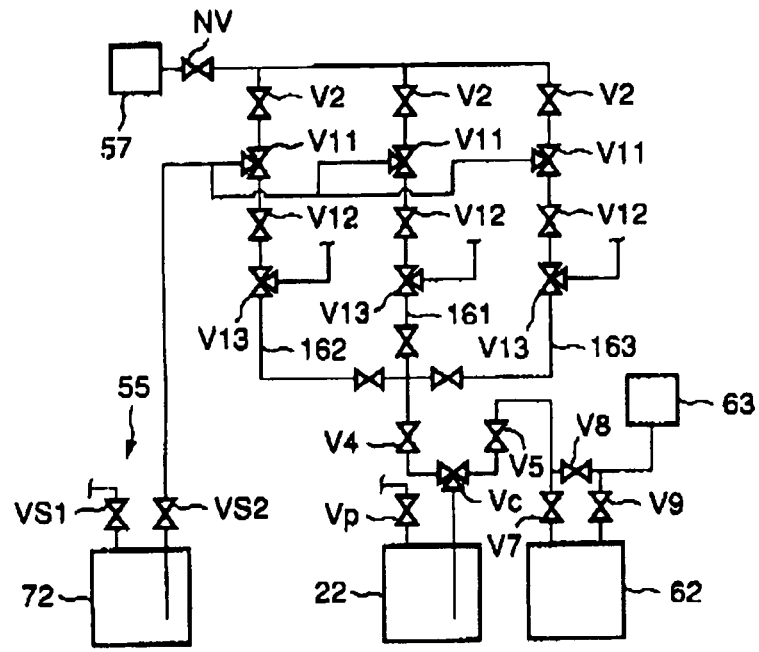
FIG. 13 illustrates a fifth embodiment of a source liquid supply apparatus.

In the apparatus illustrated in FIG. 13, the feed conduit 16 is branched into conduits 161, 162, and 163, which are themselves directed to three different process facilities. A common cleaning fluid source 55 and a common purge gas source 57 are connected, using a configuration in conformity with the apparatus illustrated in FIG. 8, to the conduits 161, 162, and 163. The conduits 161, 162, and 163 are cleaned, either simultaneously or individually, using the above-described processes S11 through S19.

Figure 14:
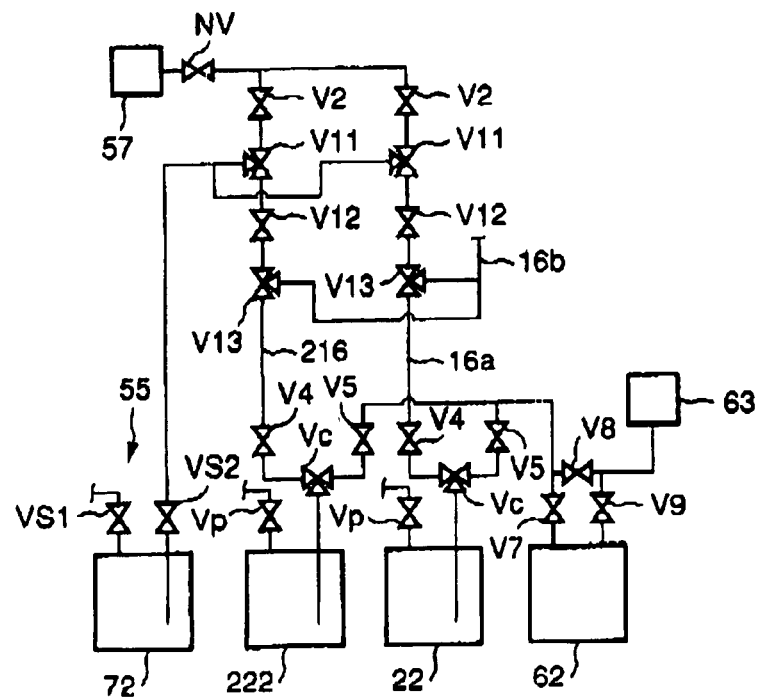
FIG. 14 illustrates a sixth embodiment of a source liquid supply apparatus.

In the apparatus (a dual tank structure) illustrated in FIG. 14, two source tanks 22 and 222 are interchangeably provided via conduits 16a and 216 for a single process facility 10. The source tank 22, a common cleaning fluid source 55, and a common purge gas source 57 are connected, using a configuration in conformity with the apparatus illustrated in FIG. 8, to the additional conduit 216. The conduits 16a and 216 are alternately cleaned using the above-described processes S11 through S19.

Figure 15:
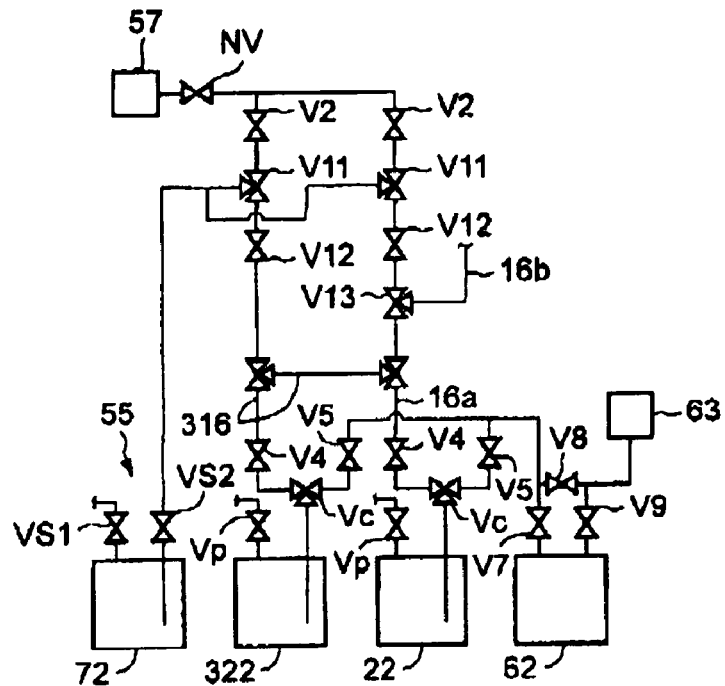
FIG. 15 illustrates a seventh embodiment of a source liquid supply apparatus.

In the apparatus illustrated in FIG. 15, an auxiliary source liquid tank 322 is connected through the conduit 316 to the source tank 22. The source tank 22, a common cleaning fluid source 55, and a common purge gas source 57 are connected, using a configuration in conformity with the apparatus illustrated in FIG. 8, to the additional conduit 316. The conduits 16a and 316 are simultaneously or alternately cleaned using the above-described processes S11 through S19.

Figure 16:
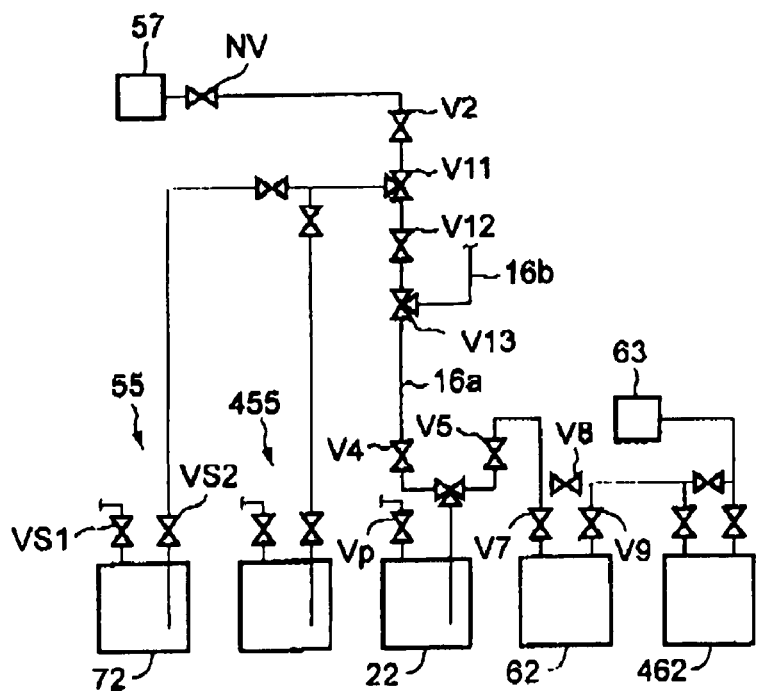
FIG. 16 illustrates an eighth embodiment of a source liquid supply apparatus.

A second cleaning fluid source 455 and a second waste tank 462 are additionally disposed in the apparatus illustrated in FIG. 16 in order to be able to use different cleaning fluids. In this case, a batch mode cleaning treatment can be run by the above-described processes S13 through S19 using either of the cleaning fluids.

While various modifications and alterations within the technical sphere of the concept of this invention can be devised by the individual skilled in the art, it should be understood that these modifications and alterations also fall within the scope of this invention.

As has been explained in the preceding, this invention provides a source liquid supply apparatus that incorporates a cleaning function and that avoids leaving source liquid- and/or cleaning fluid-derived residues in the vicinity of the joint or connection region between the source liquid feed conduit and the source tank. This invention also provides a method for detaching the source tank from the foregoing apparatus and a method for cleaning the source liquid feed conduit

The invention claimed is:

1. A source liquid supply apparatus comprising:
   a) a source of pressurization gas;
   b) a source of cleaning fluid;
   c) a source of purge gas;
   d) a prescribed facility;
   e) a leaktight source tank comprising a discharge port and a pressurization port, wherein said source tank contains a source liquid;
   f) a pressurization gas conduit, wherein said pressurization gas conduit connects said pressurization port and said source of pressurization gas;
   g) a flow-switching mechanism that is attached to said discharge port, wherein said flow-switching mechanism comprises;
      i) a first port, wherein said first port is connected to said discharge port,
      ii) a second port and a third port, which are connected to each other through an intermediate flow passage and which are connected to said first port, and
      iii) a valve member that can produce an isolated state in which communication between said first port, said second port, and said third ports is closed off while communication between said second port and said third port is maintained;
   h) a feed conduit that connects said second port to said prescribed facility;
   i) a cleaning fluid conduit that connects said feed conduit with said source of cleaning fluid;
   j) a purge gas conduit that connects said feed conduit to said source of purge gas; and
   k) an exhaust conduit that connects to said third port.

2. The source liquid apparatus of claim 1, further comprising an undivided common compartment comprising a first orifice connected to said first port, a second orifice connected to said second port, a third orifice connected to said third port, and an inner wall.

3. The source liquid supply apparatus of claim 2, wherein said undivided common compartment functions as part of said intermediate flow passage, and said valve member has the ability to close said first orifice while said second orifice and said third orifice remain open.

4. The source liquid supply apparatus of claim 1, wherein said first port is connected through a first orifice to a partial common compartment that functions as part of the intermediate flow passage, said second port and said third port are connected to each other through a connection that does not proceed through said partial common compartment and are connected to said partial common compartment through a common orifice, and said valve member has the ability to close said common orifice.

5. The source liquid supply apparatus of claim 2, wherein said valve member is supported by a bellows or a diaphragm that forms a part of said inner wall of said undivided common compartment.

6. The source liquid supply apparatus of claim 1, further comprising a vacuum exhaust member, wherein said vacuum exhaust member is connected to said exhaust conduit.

7. The source liquid supply apparatus of claim 1, further comprising a first mounting valve and a second mounting valve, wherein said first mounting valve is disposed in said feed conduit in the vicinity of said second port, said second mounting valve is disposed in said exhaust conduit in the vicinity of said third port, and said flow-switching mechanism is detachable from said first mounting valve and said second mounting valve.

8. A method for detaching the source tank of a source liquid supply apparatus of claim 7, comprising:
   a) providing a liquid supply apparatus, comprising:
      i) a source of pressurization gas;
      ii) a source of cleaning fluid;
      iii) a source of purge gas;
      iv) a prescribed facility;
      v) a leaktight source tank comprising a discharge port and a pressurization port, wherein said source tank contains a source liquid;
      vi) a pressurization gas conduit, wherein said pressurization gas conduit connects said pressurization port and said source of pressurization gas;
      vii) a flow-switching mechanism that is attached to said discharge port, wherein said flow-switching mechanism comprises;
         1) a first port, wherein said first port is connected to said discharge port,
         2) a second port and a third port, which are connected to each other through an intermediate flow passage and which are connected to said first port, and
         3) a valve member that can produce an isolated state in which communication between said first port, said second port, and said third ports is closed off while communication between said second port and said third port is maintained;
      viii) a feed conduit that connects said second port to said prescribed facility;
      ix) a cleaning fluid conduit that connects said feed conduit with said source of cleaning fluid;
      x) a purge gas conduit that connects said feed conduit to said source of purge gas;
      xi) an exhaust conduit that connects to said third port;
   b) discharging residual liquid, wherein said discharging comprises:
      i) depressurizing said exhaust conduit or said source, and
      ii) discharging source liquid remaining within the feed conduit into said exhaust conduit or said source tank by utilizing the pressure difference produced by said depressurization;
   c) feeding cleaning fluid from the cleaning fluid conduit into the feed conduit, wherein said feeding comprises:
      i) filling the interiors of said feed conduit, said second port, said intermediate flow passage, and said third port with cleaning fluid, and then;
      ii) opening said exhaust conduit and discharging said cleaning fluid into said exhaust conduit, wherein said feeding carried out after said residual liquid discharge process and in which, with said isolated state being in place and said exhaust conduit closed;
   d) purging, wherein said purging comprises:
      i) feeding purge gas from the purge gas conduit into the feed conduit so as to fill the interiors of said feed conduit, said second port, said intermediate flow passage, and said third port with purge gas, and
      ii) discharging said purge gas into said exhaust conduit after opening said exhaust conduit; and
   e) detaching, wherein said detaching comprises detaching said flow-switching mechanism and said source tank from said source liquid supply apparatus by detaching said flow-switching mechanism from said first mounting valve and said second mounting valve, wherein said detaching is carried out after said purge process.

9. The method of claim 8, further comprising;
   f) interconnecting said feed conduit and said exhaust through said first mounting valve and said second mounting valve, and flowing purge gas from said purge gas conduit through said feed conduit and into said exhaust conduit.

10. The method of claim 8, wherein c) and d) are repeated.

11. The method of claim 10, wherein step b) comprises:
   a) closing said exhaust conduit;
   b) pressurizing said feed conduit to about 0.1 to about 1 MPa by feeding said purge gas; and
   c) opening said exhaust conduit to discharge said residual liquid into said exhaust conduit.

* * * * *